United States Patent [19]

Busby

[11] Patent Number: 4,659,869

[45] Date of Patent: Apr. 21, 1987

[54] CLIP-ON STRIP FOR RFT/EMI SHIELDING

[75] Inventor: Robert B. Busby, Pawling, N.Y.

[73] Assignee: Pawling Rubber Corporation, Pawling, N.Y.

[21] Appl. No.: 824,297

[22] Filed: Jan. 30, 1986

Related U.S. Application Data

[63] Continuation of Ser. No. 755,202, Jul. 11, 1985, abandoned, which is a continuation of Ser. No. 506,010, Jun. 20, 1983, abandoned.

[51] Int. Cl.⁴ .............................................. H05K 9/00
[52] U.S. Cl. .............................................. 174/35 GC
[58] Field of Search ........................... 174/35 GC, 51; 339/95 R

[56] References Cited

U.S. PATENT DOCUMENTS

| | | | |
|---|---|---|---|
| 2,629,764 | 2/1953 | Wiley | 174/35 GC |
| 3,122,604 | 2/1964 | Cook et al. | 174/51 |
| 3,780,209 | 12/1973 | Schuplin | 174/51 |
| 3,992,897 | 11/1976 | Loos | 174/51 X |

OTHER PUBLICATIONS

Lockhart, "Spring-Clip Conductive Cover Gasket", IBM Tech. Disclosure Bulletin, vol. 20, No. 10, Mar. 1978, p. 4026.

Primary Examiner—Arthur T. Grimley
Assistant Examiner—D. A. Tone
Attorney, Agent, or Firm—Mandeville and Schweitzer

[57] ABSTRACT

A novel clip-on shielding strip is disclosed, intended particularly for cabinets for electronic equipment such as computer apparatus, and the like, where it is necessary and/or desirable to provide access doors or panels and to effectively shield such doors or panels at the closure interfaces to prevent or reduce the escape of stray radio frequency and/or electromagnetic interference radiation. The new clip-on shielding strip is characterized by a specifically advantageous physical configuration which, on the one hand, simplifies and expedites installation in the first instance and, on the other hand, assures excellent electrical grounding of the strip to the current structure, providing a high degree of reliability in the shielding function of the strip.

1 Claim, 7 Drawing Figures

CLIP-ON STRIP FOR RFT/EMI SHIELDING

RELATED APPLICATIONS

This application is a continuation of my earlier application Ser. No. 755,202, filed July 11, 1985, now abandoned, which application in turn was a continuation of my still earlier application Ser. No. 506,010, filed June 20, 1983, now abandoned.

BACKGROUND AND SUMMARY OF THE INVENTION

Operation of conventional computer equipment, for example, is typically accompanied by the generation of radio frequency and/or electromagnetic radiation in the electronic circuitry of the computer system. If not properly shielded, such radiation can cause considerable interference with entirely unrelated equipment. Accordingly, governmental regulations, as well as sound manufacturing practice dictate that the sources of radio frequency and/or electromagnetic radiation within the computer system be effectively shielded and grounded.

In instances where the radiation-generating circuitry is permanently or semipermanently housed in a container, effective shielding may be accomplished easily through proper construction of the enclosure structure. In certain cases, however, effective RF interference (RFI) or electromagnetic interference (EMI) shielding present somewhat more difficult problems. This is particularly true, for example, where the equipment housing is provided with a readily openable access panel or door, for servicing or other routine access. In addition, large numbers of computer installations have been made in the past without a full understanding of the effect of partially unshielded enclosures, particularly involving access doors. Accordingly, many manufacturers and/or users of older computer equipment are attempting to upgrade the level of RFI/EMI shielding through retrofit installation of shielding devices around the access openings. To this end, it has been known heretofore to provide a clip-on shielding device adapted to be pressed or clipped onto an exposed sheet metal edge, typically provided at the peripheral edges of an access door of a conventional sheet metal housing or enclosure for a computer installation. A device of known construction includes a continuous, roll-formed strip metal clip, to one side surface of which has been bonded a resilient tubular element of electrically conductive elastomer. The clip is constructed so as to be applyable over the edge of sheet metal door or panel and retained in place by frictional gripping action of the roll-formed clip. The configuration of the element is such that the resilient tubular elastomer, bonded to the clip, is brought into contact with a fixed surface of the enclosure, when the door or panel is closed, effectively sealing off the narrow gap otherwise typically provided between a door or panel and the oppositely facing surface areas of the housing.

Known clip-on shielding devices as described above, while reasonably effective for many applications, have been characterized by certain shortcomings. In this respect, the known devices have proven to be somewhat inconvenient to install. Moreover, and perhaps of greater importance, the presence of a good quality coating over the metal surface tends to inhibit good electrical contact and, in cases, may reduce or negate the effectiveness of the shielding strip, unless special provisions are made to remove areas of the coating down to bare metal.

In accordance with the present invention, specific improvements are incorporated in a clip-on strip of otherwise known design to the end of making the clip-on device significantly easier to install and assuring in all cases the presence of an excellent conductive contact between the rolled metal clipping element and the door or panel to which it is secured. The improvements of the present invention are achieved with little or no increase in the cost of manufacture of the device, yet result in savings in time and cost in installation while assuring improved operating performance from the device.

For a better understanding of the above and other features and advantages of the invention, reference should be made to the following detailed description of a preferred emdodiment and to the accompanying drawings.

DESCRIPTION OF THE DRAWINGS

FIG. 1 is a simplified perspective illustration of a typical cabinet with access door, for housing computer circuitry or the like.

DESCRIPTION OF A PREFERRED EMBODIMENT

Figure 1:
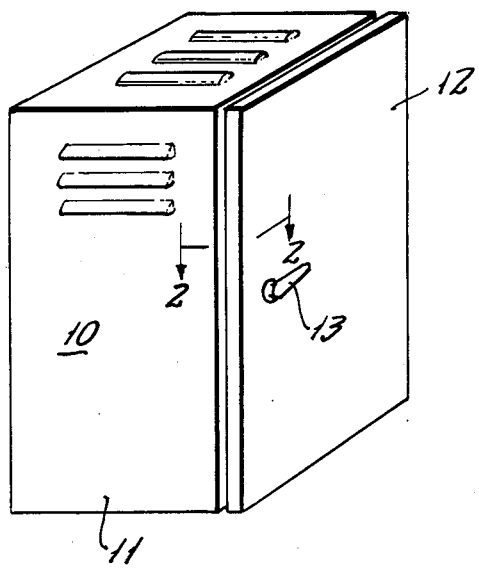
Figure 2:
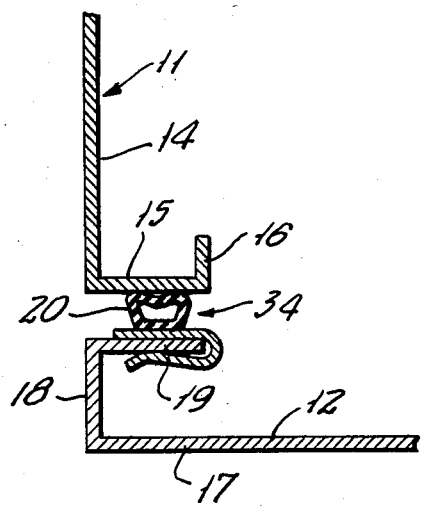
FIG. 2 is an enlarged, fragmentary cross sectional view as taken generally on line 2—2 of FIG. 1.

Referring now to the drawing, the reference numeral 10 (FIG. 1) designates generally a sheet metal cabinet suitable for housing electronic circuitry, such as computer equipment and the like. The cabinet includes a main body 11 and access door 12. The door in the illustrated arrangement is hinged along the right-hand side and provided with an opening latch 13 along the left-hand side. Typically, the construction of a sheet metal cabinet 10 includes rolled-over edge flanges both to strengthen the cabinet structure and to conceal raw edges of the basic sheet metal material. In FIG. 2, for example, there is illustrated, fragmentarily, a sidewall 14 of the cabinet body 11. At its front edge region, the sidewall 14 is provided with a first in-turned flange section 15, extending at right angles to the sidewall, and a second, rearwardly turned edge flange 16, which extends rearwardly back into the cabinet body. The door 12 includes a main front panel section 17 provided at its peripheral edges with a rearwardly turned flange section 18, and an inturned flange extremity 19.

As reflected in FIG. 2, the inturned flange 19 of the door panel confronts the peripheral flange 15 of the cabinet body 11. In order to prevent the uncontrolled escape of radio frequency and electromagnetic radiation from the region of the confronting surfaces 15, 19, it is known to provide for resilient, electrically conductive gasket means between the confronting surfaces such that, when the door or access panel 12 is secured in its closed position, the conductive gasket effectively seals off the perimeter interstice and provides for electrical continuity with at least one of the confronting elements of the cabinet structure, such that the RF and EM energy is intercepted and dissipated.

Figure 5:
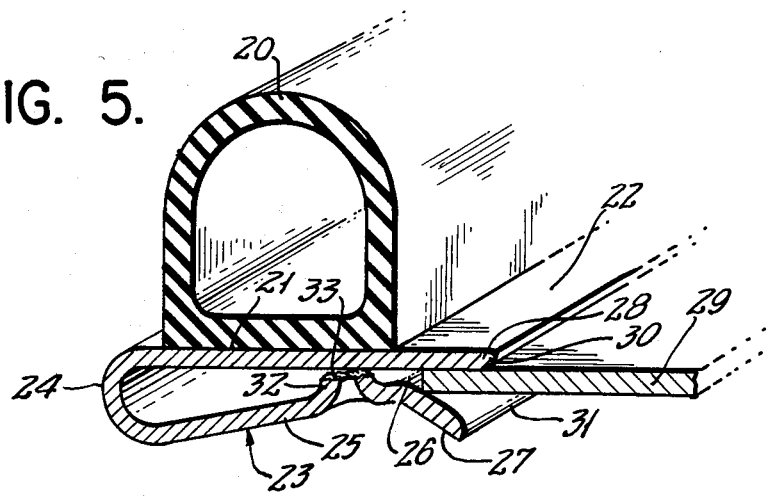
FIG. 5 is an enlarged perspective view, in cross section, illustrating construction details of the new clip-on shielding strip according to the invention.

In one known form of gasket device, a conductive tubular element, formed of an extruded, resilient elastomer, is condutively bonded to a continuous, roll-formed U-shaped metal strip, of the general nature of the strip illustrated in FIG. 5, which is applied over the inturned edge flange 19 of the access panel 12, either during the initial manufacture of the cabinet, or as a subsequent retrofit. The present invention relates to specific improvements in the shielding element, particularly in the rolled metal clamping strip, to the end that the device may be installed in a more facile and expeditious manner (and therefore less expensively) and which in addition provides a superior and more reliable shielding function as compared to known devices.

Figure 6:
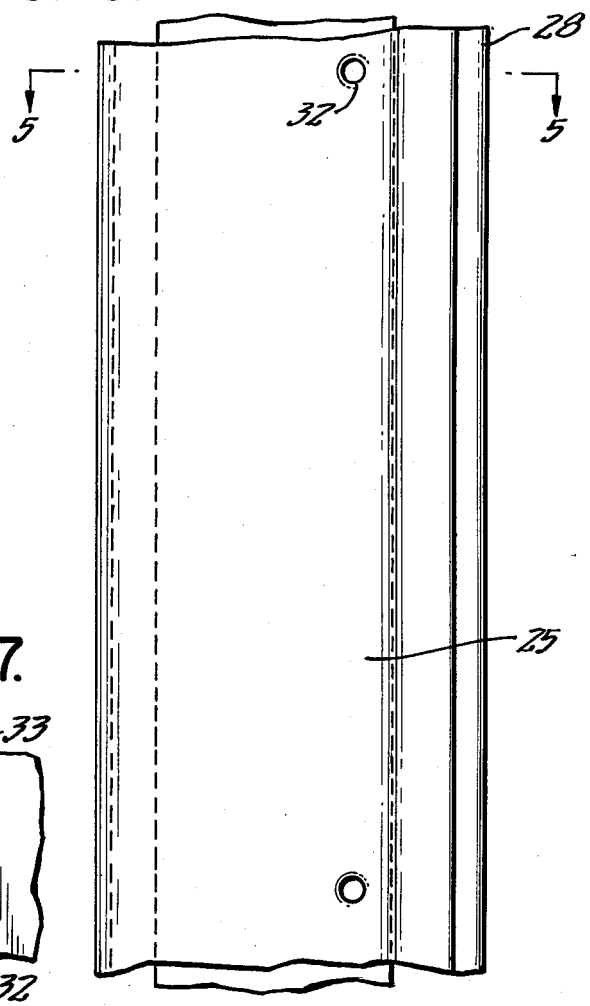
FIG. 6 is a fragmentary bottom plan view of the new strip.
Figure 7:
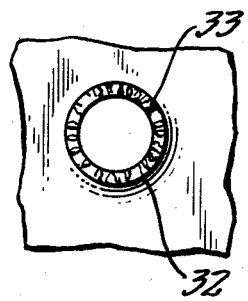
FIG. 7 is a highly enlarged, fragmentary top plan view, illustrating an advantageous form of grounding prong as incorporated in the device of the inventor.

With reference more specifically to FIGS. 5 and 6, the clip-on shielding device comprises a continuous, extruded tubular element 20 of a conductive elastomer, preferably a conductive silicone rubber compound. The elastomer strip 20 is nonadhesively but continously bonded at 21 to a flat outer wall 22 of a continuous metal clip element, generally designated by the numeral 23. Both the clip 23 and the resilient element 20 are desirably formed in more or less continuous lengths and then severed to appropriate shorter lengths for installation along the peripheral edges of an access panel or the like.

In the specifically illustrated form of the invention, the continuous clip 23 desirably is formed of stainless steel strip, approximately 0.020 inch thick. This is shaped by continuous roll-forming techniques into a generally U-shaped clip form as illustrated. For a typical application, the cross section of the clip may have an overall width of approximately one-half inch, providing a broad, flat wall surface 22 for bonding to the resilient strip 20. Desirably, the resilient strip is nonadhesively bonded to the flat outer surface 22 of the clip, in order to provide for an adequately high level of electrical conductivity from the resilient element to the metal clip.

At the closed end 24 of the clip, the strip material is bent through an angle of somewhat greater than 180°. For a typical application, in which the clip is adapted to be applied over cabinet sheet metal of, for example, around 0.020–0.040 inch in thickness, the closed end of the clip is desirably somewhat wider than that, typically on the order of, say, 0.0120 inch external (0.080 inch internal). The inside face or wall 25 converges gradually toward the front wall 22 to a narrow throat section 26, from which the inside wall diverges rather sharply, at an angle of, say, 30° from the plane of the front wall, to provide for a convergent, funnel-like entry. At the throat 26, the nominal spacing between the front and back walls of the clip is at least slightly less than the thickness of the cabinet sheet material. To this end, a spacing of 0.015 inch or less is acceptable for the usual cabinet sheet metal of, say, 0.020–0.040 inch thickness.

Pursuant to one specific aspect of the invention, one side of the metal clip, and preferably the flat side 22, projects beyond the other side, at the open end, for a distance of around 0.040 inch. This greatly facilitates the installation of an elongated length the clip material at the cabinet edge, since the projecting portion 28 of the clip provides a preliminary guide surface, enabling an elongated strip of the shielding material to be applied to the edge of the access panel in a most expeditious and economical manner. Thus, even though the divergent opening, at the open end of the clip is substantially larger than the thickness of the sheet metal panel 29 (FIG. 5), it is significantly helpful to have a projecting guide lip 28 along one side, preferably the flat side 22, to facilitate assembly. Additionally, it is desirable to radius the end edges of the clip material, as at 30 and 31 to help guide the clip onto the metal panel. The center of curvature of these edge radii desirably are at or outside of the outer surfaces of the strip material, such that the radiused edges form a continuation of the divergent opening into the throat area 26 of the clip.

Pursuant to another significant aspect of the invention, the strip material of the clip is formed with periodic sharp projecting prongs 32, sometimes referred to as grounding prongs, advantageously of circular configuration, which are punched from the strip material and deformed inward toward the opposite wall of the clip. To advantage, the prongs 22 are located on the inner wall 25 of the clip, and project toward the outer wall 22. Pursuant to one aspect of the invention, the grounding prongs 32 are formed with sharp, irregular (ragged) end edges 33 engageable with the inner surface of the cabinet panel 29.

As reflected in FIG. 5, the grounding prongs 32 are located slightly behind the throat 26, such that, as an edge margin of the sheet metal panel 29 enters the clip recess, it first contacts the throat area of the clip, slightly separating the opposed walls 22, 25 of the clip, and then engages the sharp, ragged tips 33 of the inwardly projecting grounding prongs 32. The geometry of the grounding prongs 32 is such that the sharp projecting points 33 thereof lie slightly above the inside surfaces of the throat area 26, as the device is viewed in FIG. 5. Accordingly, when the sheet metal panel passes through the throat area, it engages, with slight interference, the sharp tip portions 33 of the prongs. The prongs 32, pursuant to the form of the invention shown in FIGS. 5 and 6, are spaced relatively widely apart (e.g. two inches or more) such that the resistance of the prongs may be overcome by slightly increasing the inward pressure on the clip during its assembly to the panel. Importantly, the sharp tip areas 33 of the grounding prongs dig into and scratch the under surface of the panel, peeling away any paint or other surface coating and providing a relatively clean metal-to-metal contact between the clip and the panel material. To a lesser degree, the grounding prongs help secure the clip in place.

As reflected particularly in FIG. 5, the inward displacement of the triangular grounding prongs 32 typically is less than the thickness of the metal, such that the prongs do not form a solid barrier to the insertion of the panel edge into the recess of the clip.

Typically, the prongs 32 are formed by punching through the inner wall 25 of the clip with a sharp, tapered punching tool. When the punching tool breaks through the strip material, it tends to tear the material slightly as it is forced away from the advancing tool. The operation results in the formation of a blunt, generally cylindrical prong, typically around 1/32 inch in height and 1/16 inch in diameter. Around the upper edge extremity, the prong has a series of irregular, somewhat triangular grounding relatively sharp, somewhat ragged tip areas 33 which serve to engage the cabinet sheet material during application of the clip. This results in the scraping away of the cabinet coating material sufficiently to provide excellent metal-to-metal contact for grounding purposes. The multiple edges 33 also serve very effectively to enhance the gripping action of the clip to the cabinent metal.

Figure 3:
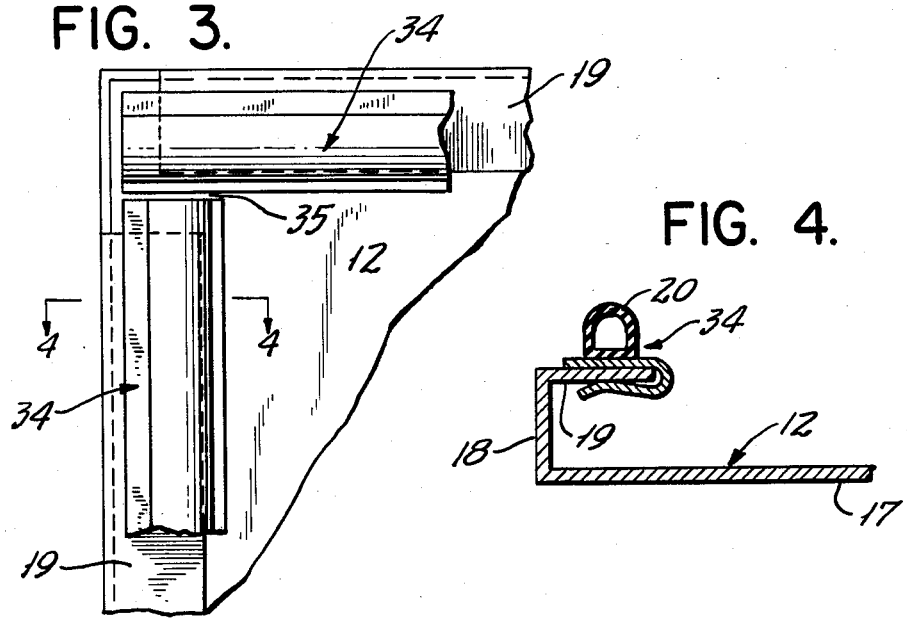
FIG. 3 is an enlarged, fragmentary elevational view illustrating the installation of the new shielding clip arrangement in a corner area of the access door.
Figure 4:
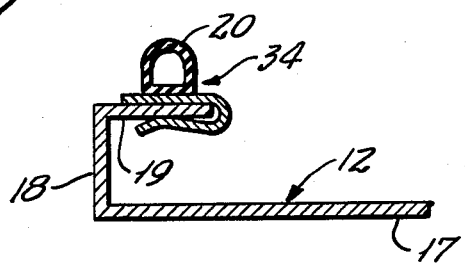
FIG. 4 is a cross sectional view as taken generally on line 4—4 of FIG. 3.

Installation of the shielding clip typically is done in the manner shown in FIG. 3, which illustrates a corner section of the axis panel 12. It will be noted in FIG. 3 that the in-turned flanges 19 terminate somewhat short of the corner extremity. Typically, one of the flanges, the vertical flange in the illustration of FIG. 3, terminates well short of the edge of the panel, providing for some degree of overlap by its neighboring flange, which is the horizontal flange in the specific illustration. For puposes of terminology, the flange which terminates short of the panel end to allow the neighboring flange to overlap may be referred to as the attenuated flange and its counterpart the non-attenuated flange. As shown in FIG. 3, the shielding strip, designated generally by the numeral 34 is applied first to the non-attenuated flange. Before installation, the shielding strip is cut to a length substantially equal to the internal width of the panel or door. The shielding strips intended for the attenuated flanges are cut to a length to extend substantially the full distance between the shielding strips previously installed on the non-attenuated flanges. The gap 35 (if any) which remains is aligned on a narrowly focused axis extending closely along the inner edges of the shielding strips attached to the non-attenuated flanges. Accordingly, little if any RF or EM radiation escapes from this slight gap. More typically, the electronic circuit devices, which constitute the sources of radiation, are located in the center areas of the cabinet 10, and the radiation emanating therefrom does not align itself with the access of the gap 35.

As shown in FIG. 2, after the shielding clip 34 has been applied to the internal peripheral flanges of the panel 12, when the panel is closed or installed, as the case may be, the conductive elastomeric elements 20 engage and seal off the space between the opposing flanges 19, 15, of the panel and cabinet body proper. Because of the conductivity of the elastomeric element, a complete circuit is provided from the elastomeric element 20 to the access panel or door 12 to provide a highly effective degree of RFI/EMI shielding. The conductive elastomer, advantageously Pawling Rubber Corporation silicone compound No. 9782 or No. 80785, when continuously but non-adhesively bonded to the stainless clip material, provides adequate conductivity for the purposes intended, and the provision of the grounding prongs 32, at spaced points along the length of the shielding clip, assures that the clip and the resilient elastomeric element 20 bonded thereto, are adequately grounded to the metal of the access door or panel 12.

The device of the invention, constitutes a significant improvement over existing devices of the same type in providing for a greater degree of facility and installation and a higher degree of reliability in operation, without significant increase in manufacturing cost. By especially shaping the clip to provide for an operative degree of projection of the flat-sided wall of the clip element, with respect to the divergently disposed edge portion of the opposite wall of the clip, the proper alignment of the strip along the edge of the panel, for installation of an elongated shielding element, is easily accomplished. To advantage, this projecting portion may be on the order of 0.040 inch. There is no harm in making it somewhat larger, although the benefits of doing so, as compared to the additional material utilized, etc. may result in somewhat diminishing returns.

Importantly, the clip is provided with a plurality of spaced grounding prongs arranged with sharp, ragged tip edges to dig into the parent metal of the cabinet flange, when the strip is installed, to provide reliably for a grounding contact between the strip and the parent metal of the cabinet. Most advantageously, the grounding prongs are small, circular prongs, integral with the basic strip material but displaced at the tip portion into the panel-receiving cavity of the clip and arranged with the sharp, ragged ends of the prong projected into the cavity. The arrangement is such that, as the clip is applied over the edge of the panel flange, the sharp tips 33 of the grounding prongs literally dig into the metal of the panel, making a clean scratch through paint or other surface coatings on the panel and assuring reliable and adequate electrical contact between the panel material and the clip material as well as enhanced gripping.

It should be understood, of course, that the specific form of the invention herein illustrated and described is intended to be representative only, as certain changes may be made therein without departing from the clear teachings of the disclosure. Accordingly, reference should be made to the following appended claims in determining the full scope of the invention.

I claim:

1. In an RFI/EMI shielding strip for electronic cabinets and the like and of the type comprising an elongated rolled metal strip of generally U-shaped cross section formed by front and back principal walls and having open and closed edges, said strip being of great length in relation to its width and being adapted to frictionally engage the edge of a cabinet panel, and a generally coextensive length of resilient, conductive elastomer mounted on and conductively associated with the front wall of said roller metal strip, the improvement characterized by
  (a) the front wall of said strip, on which said conductive elastomer is mounted, being substantially flat over most of its width,
  (b) said front wall having an edge projection along the open edge of the strip extending beyond the free end extremity of the back wall to form an installation guide surface,
  (c) said back wall having convergent and divergent wall portions, relative to said front wall, forming a throat area intermediate the side edges of the strip,
  (d) the back wall of said strip extending divergently from said throat area toward the closed edge of the strip,
  (e) a plurality of sharp, pointed grounding elements periodically spaced along the length of the back wall of said strip for establishing metal-to-metal contact between said strip and the panel to which said strip is mounted,
  (f) said grounding elements projecting at least slightly closer to said front wall than the back wall in the region of said throat,
  (g) said grounding elements being located closely adjacent said throat area but spaced on the side thereof toward said closed edge of the strip,
  (h) said grounding elements being spaced apart along the length of said strip, with a separation of at least about two inches to accommodate progressive manual application of an elongated strip to an electronic cabinet.

* * * * *